(12) United States Patent
Lachapelle

(10) Patent No.: US 11,039,553 B1
(45) Date of Patent: Jun. 15, 2021

(54) CONTROLLED BYPASS TEMPERATURE BASED PRESSURE AND AIRFLOW CONTROL

(71) Applicant: Amazon Technologies, Inc., Seattle, WA (US)

(72) Inventor: Alan Joseph Lachapelle, Reston, VA (US)

(73) Assignee: Amazon Technologies, Inc., Seattle, WA (US)

( * ) Notice: Subject to any disclaimer, the term of this patent is extended or adjusted under 35 U.S.C. 154(b) by 278 days.

(21) Appl. No.: 16/007,841

(22) Filed: Jun. 13, 2018

(51) Int. Cl.
*H05K 7/20* (2006.01)
*G05B 19/042* (2006.01)

(52) U.S. Cl.
CPC ....... *H05K 7/20836* (2013.01); *G05B 19/042* (2013.01); *H05K 7/20745* (2013.01); *G05B 2219/2614* (2013.01)

(58) Field of Classification Search
CPC .......... H05K 7/20836; H05K 7/20745; G05B 19/042; G05B 2219/2614
USPC ......................................................... 700/276
See application file for complete search history.

(56) References Cited

U.S. PATENT DOCUMENTS

| | | | | |
|---|---|---|---|---|
| 3,785,390 A | * | 1/1974 | Taylor | F15C 1/14 137/13 |
| 5,414,591 A | * | 5/1995 | Kimura | G06F 1/20 361/679.33 |
| 9,823,715 B1 | * | 11/2017 | Roy | G06F 1/20 |
| 10,427,538 B2 | * | 10/2019 | Myers | F25B 9/04 |
| 2005/0276017 A1 | * | 12/2005 | Aziz | H05K 7/20572 361/695 |
| 2008/0245083 A1 | * | 10/2008 | Tutunoglu | F25B 49/005 62/115 |
| 2010/0144265 A1 | * | 6/2010 | Bednarcik | H05K 7/20745 454/184 |
| 2012/0037353 A1 | * | 2/2012 | Coors | H05K 7/20745 165/279 |
| 2014/0031956 A1 | * | 1/2014 | Slessman | G05B 13/02 700/28 |

(Continued)

FOREIGN PATENT DOCUMENTS

CN 107264222 A * 10/2017

OTHER PUBLICATIONS

Machine Translation of the Claims for CN 107264222 A (Year: 2017).*

(Continued)

*Primary Examiner* — Jigneshkumar C Patel
(74) *Attorney, Agent, or Firm* — Kilpatrick Townsend & Stockton LLP

(57) ABSTRACT

A cold air outlet assembly can include one or more cold air outlets arranged to channel cold air to a contained cold region or cold aisle, and one or more bypass ducts arranged to fluidly connect a hot external environment with the cold region adjacent the cold air outlets. The bypass ducts include backdraft dampers arranged to allow flow of hot air from the hot environment to the cold region and restrict flow of cold air from the cold region to the hot environment so that, in operation, limited mixing of hot air and cold air within the cold region occurs under low pressure conditions in the cold region. The temperature of the mixed hot and cold air can be sensed and used for controlling airflow to the cold region.

19 Claims, 11 Drawing Sheets

(56) References Cited

U.S. PATENT DOCUMENTS

| | | | |
|---|---|---|---|
| 2014/0190198 A1* | 7/2014 | Slessman | H05K 7/20836 |
| | | | 62/314 |
| 2014/0206272 A1* | 7/2014 | Kodama | H05K 7/20836 |
| | | | 454/184 |
| 2016/0081232 A1* | 3/2016 | Zhu | H05K 7/20718 |
| | | | 361/679.49 |
| 2016/0213053 A1* | 7/2016 | Frehn | A23L 5/10 |
| 2016/0234973 A1* | 8/2016 | Levesque | H05K 7/20745 |
| 2017/0164523 A1* | 6/2017 | Endo | H05K 7/20145 |
| 2018/0202396 A1* | 7/2018 | Zhang | F02M 26/04 |
| 2018/0268863 A1* | 9/2018 | Gale | G11B 23/287 |
| 2019/0335623 A1* | 10/2019 | Gao | H05K 7/20745 |

OTHER PUBLICATIONS

Machine Translation of the Description for CN 107264222 A (Year: 2017).*

* cited by examiner

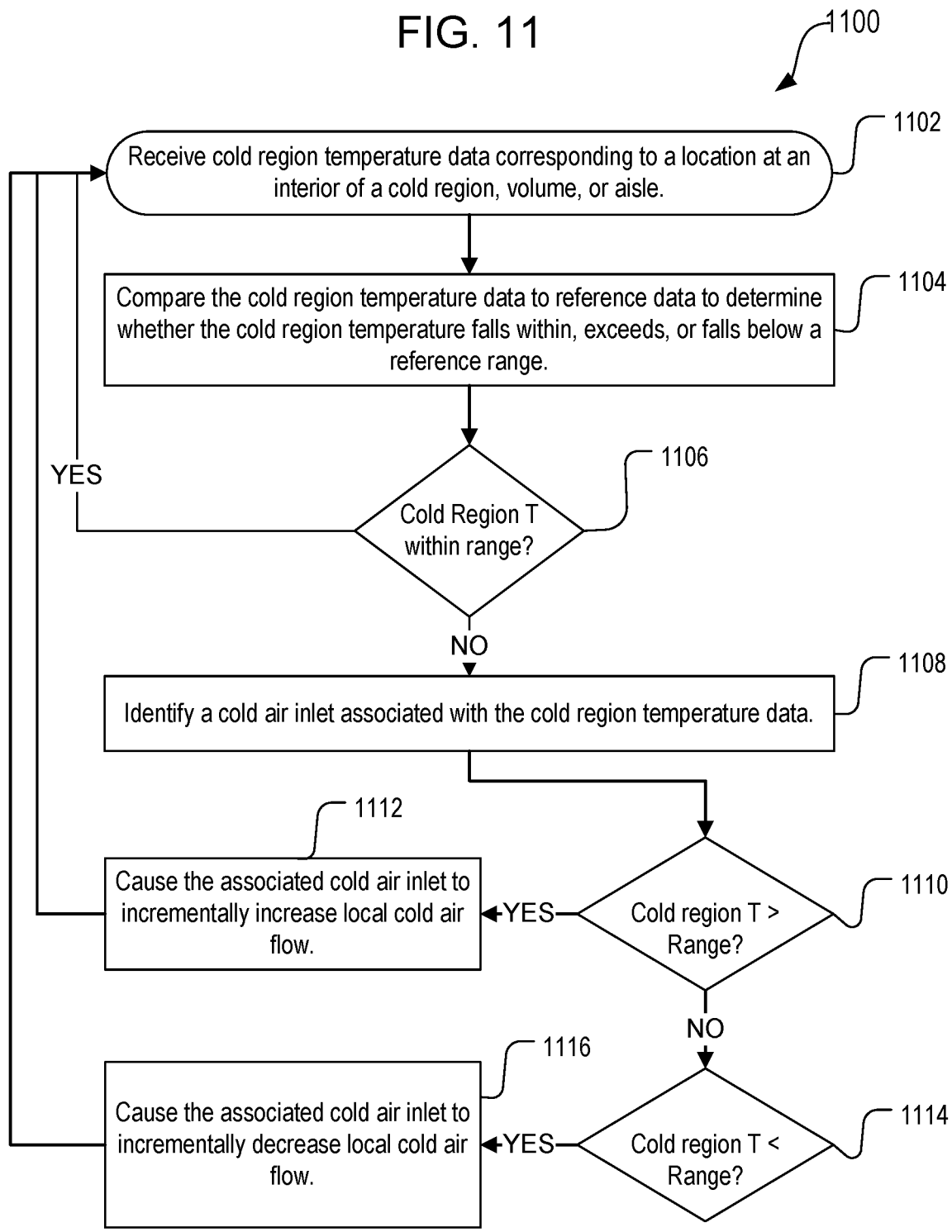

US 11,039,553 B1

CONTROLLED BYPASS TEMPERATURE BASED PRESSURE AND AIRFLOW CONTROL

BACKGROUND

A datacenter typically contains a collection of computer servers and components for the management, operation and connectivity of those servers. Even in isolation, datacenter electronic components may generate sufficient heat that temperature management is important to prolong the life of the components and for smooth and continuous operation of the datacenter.

Datacenter electronic components are often arranged together. For example, datacenter electronic components can be vertically arranged in racks or within server cabinets. When heat-generating electronic components are arranged together, however, the cumulative generation of heat can increase the ambient temperature and exacerbate the challenge of managing the temperature of individual components.

Datacenter electronic components may be cooled by passing air through the components. In some cases, this cooling is achieved by having individual components or groups of components equipped with fans that push air through the components. The effectiveness of a cooling system is related to the rate of airflow past the heat-generating components and the relative temperature of the air as it passes through the system. Therefore it can be advantageous to carefully control airflow to drive cool air where it is most needed and to efficiently exhaust hot air from the system. One such system for controlling airflow in a cooling system is a hot aisle/cold aisle system, which employs contained cold aisles to direct cooling air into the components, and hot aisles for drawing heat from the components. Such systems, however, may be sensitive to temperature spikes resulting from failures in containment or underpressure in the cold aisle, which can detrimentally impact the rate of circulation.

BRIEF DESCRIPTION OF THE DRAWINGS

Various embodiments in accordance with the present disclosure will be described with reference to the drawings, in which:

FIG. 11 illustrates a fourth example process for controlling a cooling system, in accordance with various embodiments of the present disclosure.

DETAILED DESCRIPTION

Figure 1:
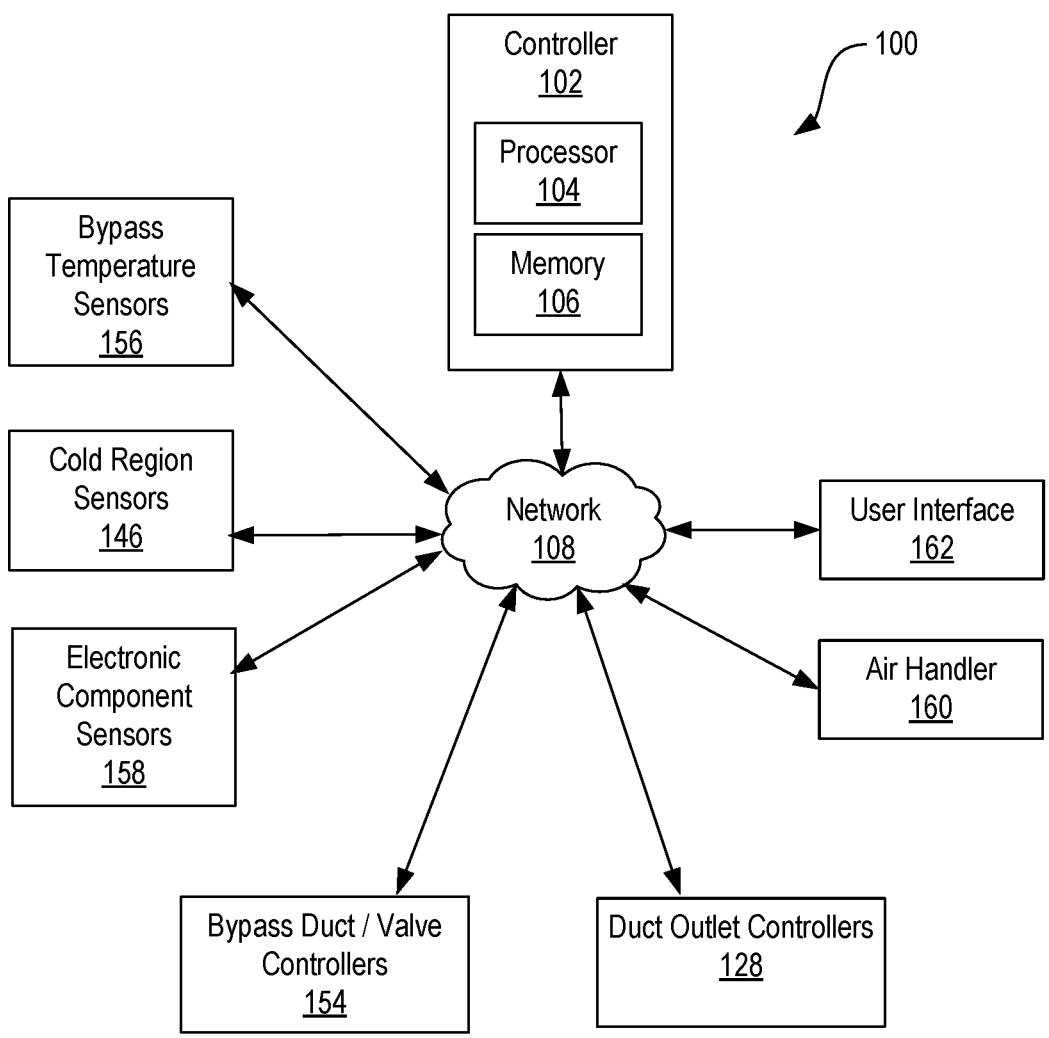
FIG. 1 is a simplified block diagram illustrating a system for temperature-based airflow management in a contained cold aisle cooling system with controlled mixing of a cold air supply with a hot air bypass.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Cooling systems generally operate by providing a flow of a working fluid that absorbs and removes heat from the components to be cooled. In systems such as datacenters, some examples of components to be cooled include servers and power management components. Similar cooling systems may be used for various other applications such as cooling personal computers, vehicles, power production facilities, for home or commercial cooling and ventilation systems, and the like. In most cases, the working fluid must be moved by way of a fan, pump, or other actuator local to the device to be cooled, e.g. cooling fans contained in or adjacent to datacenter electronic components.

Although airflow can be enhanced at the component level by fans, larger cooling systems such as those present in datacenters often use regional or aisle-based cooling systems instead of or in tandem with local cooling fans. One commonly employed system uses a cold aisle, which is a contained space adjacent to the air inlets of many heat-generating electronic components. This cold aisle receives a cold flow of air, often drawn from outside the datacenter. The cold flow of air can exit the cold aisle through or past the heat-generating electronic components, where it passes into a "hot aisle," or hot environment around the contained cold aisle, from which it is then exhausted. Employing a hot aisle/cold aisle arrangement or contained cold-aisle arrangement advantageously provides more efficient cooling than merely circulating local air, and can work in tandem with local fans to ensure that temperatures remain in a suitable range with relatively low energy expenditure.

In most cold aisle/hot aisle systems, the cold aisle must be at a higher pressure than the hot aisle, so that the direction of airflow is generally from the cold aisle toward the hot aisle through the components. A reversed pressure differential will tend to cause recirculation of hot air through any gaps or interstices in the cold aisle containment, and the elevated temperature in the cold aisle will cause the fans or other local airflow components of the electronic hardware to work harder in order to move cooling air across their componentry. However, a high pressure differential is inefficient, as it requires excess work by the air handlers that circulate the flow of cold air into the cold aisle, and will cause some excess cold air to escape the cold aisle without being productively harnessed for cooling.

In accordance with various embodiments of the present disclosure, improved control of the airflow in a datacenter or similar temperature controlled environment can be achieved by promoting limited mixing or leakage of hot air from outside the cold environment, and controlling the temperature and/or volume of the cold air flow based on a detected temperature in a mixed region of the cold environment. For example, in a cold aisle in a datacenter, controlled bypass ducts can be positioned adjacent or through any number of cold air outlets so that, in the event that the pressure differential between the cold aisle and adjacent hot aisle decreases, limited amounts of hot air will recirculate into the cold aisle in a controlled manner through the controlled bypass ducts.

The air temperature in a mixed region within the cold aisle, i.e. a region downstream of the cold air outlets and bypass ducts, can be measured regularly or continuously, and compared to a set point or target temperature in order to determine whether excess hot air/cold air mixing has occurred. Excess hot air/cold air mixing is indicative of low pressure in the cold aisle or negative pressure differential between the cold aisle and hot aisle, for example; and the absence of mixing is indicative of a positive pressure differential. This comparison can be used to trigger adjustments in the airflow, e.g. to increase a flow rate of cold air from the cold air outlets or decrease the temperature of the cold air, or to relax the flow rate of cold air if excess cold air is being provided.

Various specific configurations of an insert are described herein, and may be used in conjunction with any suitable aisle-based cooling system to sense pressure fluctuations between hot and cold regions or aisles, and even to enable or automate the response to a low pressure event.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Turning now to the drawings, in which like numbers denote like parts between figures, FIG. 1 is a simplified block diagram illustrating a system 100 for managing temperature-based pressure and airflow monitoring and control in a hot aisle/cold aisle cooling system, in accordance with various embodiments. The system 100 includes a controller 102 which includes a processor 104 and memory 106 that, when accessed by the processor, contain instructions for managing components of the system. The controller can communicate with the various components of the system 100 by way of a network 108, which can be any suitable form of wireless network (e.g. Bluetooth, WiFi, or the like) or wired network, or combination, including direct connection between the controller 102 and any suitable component.

The system 100 can include various sensors and control components for measuring temperatures, controlling airflow and air temperature in the system, and the like. For example, the system 100 can include one or more bypass temperature sensors 156 for detecting temperatures in hot air bypass ducts, cold region temperature sensors 146 for detecting temperatures within the contained cold regions or cold aisles, and electronic component temperature sensors 158 for detecting conditions at the electronic components cooled by the system. The system can include a user interface 162, which can include element such as user input/output devices, which may include mobile devices such as laptops, tablets, mobile phones, or the like. The system can also include air handlers 160 for providing airflow to the cold regions or cold aisles, and in some embodiments, can include controllers for actuating some elements in the system, such as bypass duct valve controllers 154 for controlled opening or closing of bypass duct valves, or duct outlet controllers 128 for controlled opening or closing of the cold air duct outlets.

Figure 2:
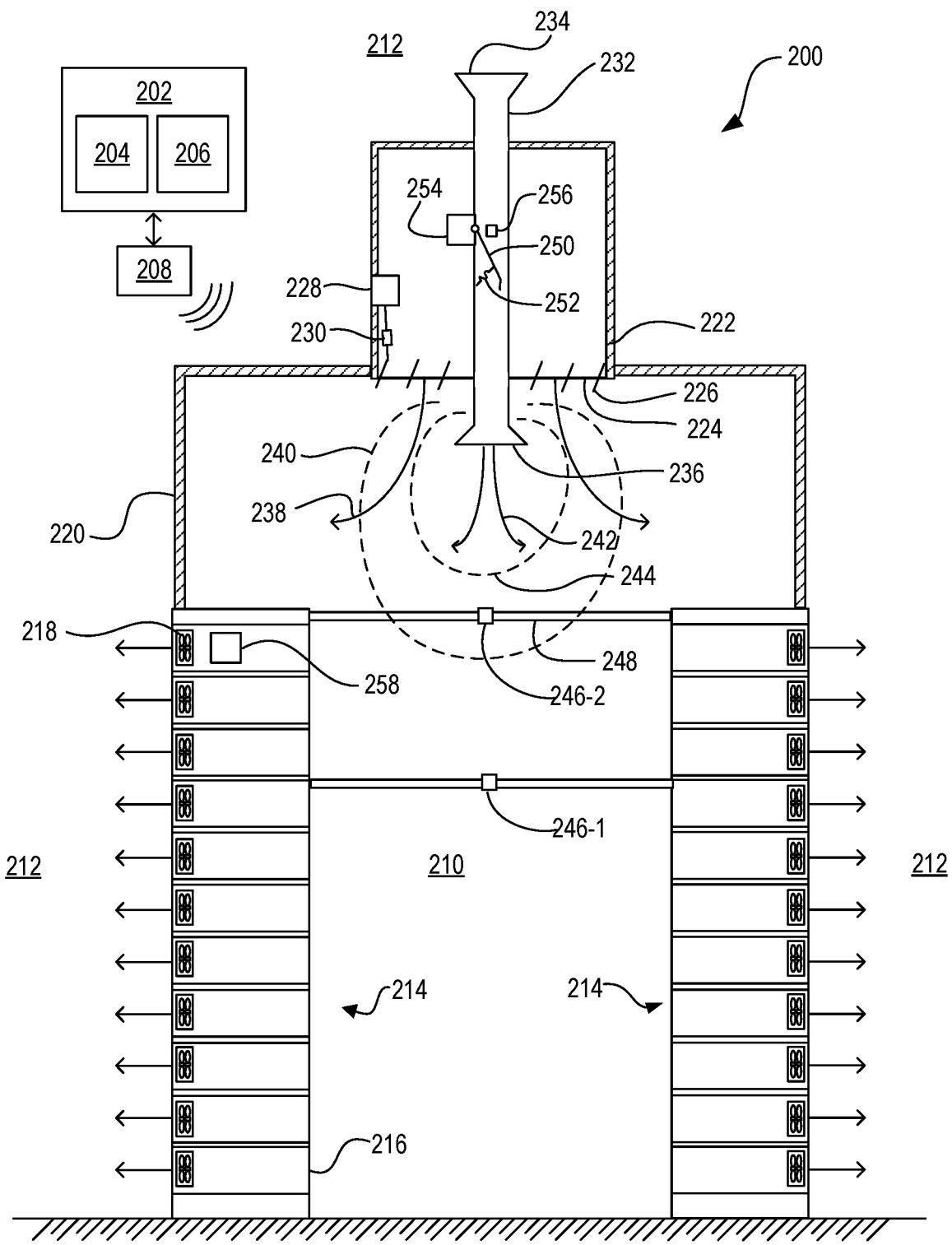
FIG. 2 is a side view diagrammatical illustration of a first example of a contained cold aisle system employing controlled mixing of a cold air supply with a hot air bypass with discrete cold air outlets and hot air bypass ducts passing through the cold air outlets.

FIG. 2 is a side view diagrammatical illustration of an example of a hot aisle/cold aisle system 200 employing a hot air bypass duct 232 positioned within a cold air duct outlet 222. The system 200 can include a controller 202 with a processor 204 and memory 206, similar to the controller 102 described above with reference to FIG. 1, and which may communicate with other aspects of the system by way of, e.g., network 208.

In accordance with various embodiments, the system 200 includes a cold region 210 separated from a hot region 212 by an electronic component rack 214 and containment element 220. In some embodiments, the cold region 210 is a cold aisle, and the hot region 212 is a hot external environment around the cold aisle. In operation, cold air is passed from the cold region 210, through the individual electronic components 216, and exhausted into the hot region 212 from which it is ultimately removed from the system. The electronic components 216 can include fans 218 for controlling the rate of airflow immediately across each component, and the cold region 210 is pressurized to promote airflow across the electronic components. In some embodiments, the electronic components 216 can include electronic component temperature sensors 258 for detecting local temperatures at the components, which can be used for determining whether a set airflow condition of the system is providing sufficient cooling to the electronic components.

Figure 3:
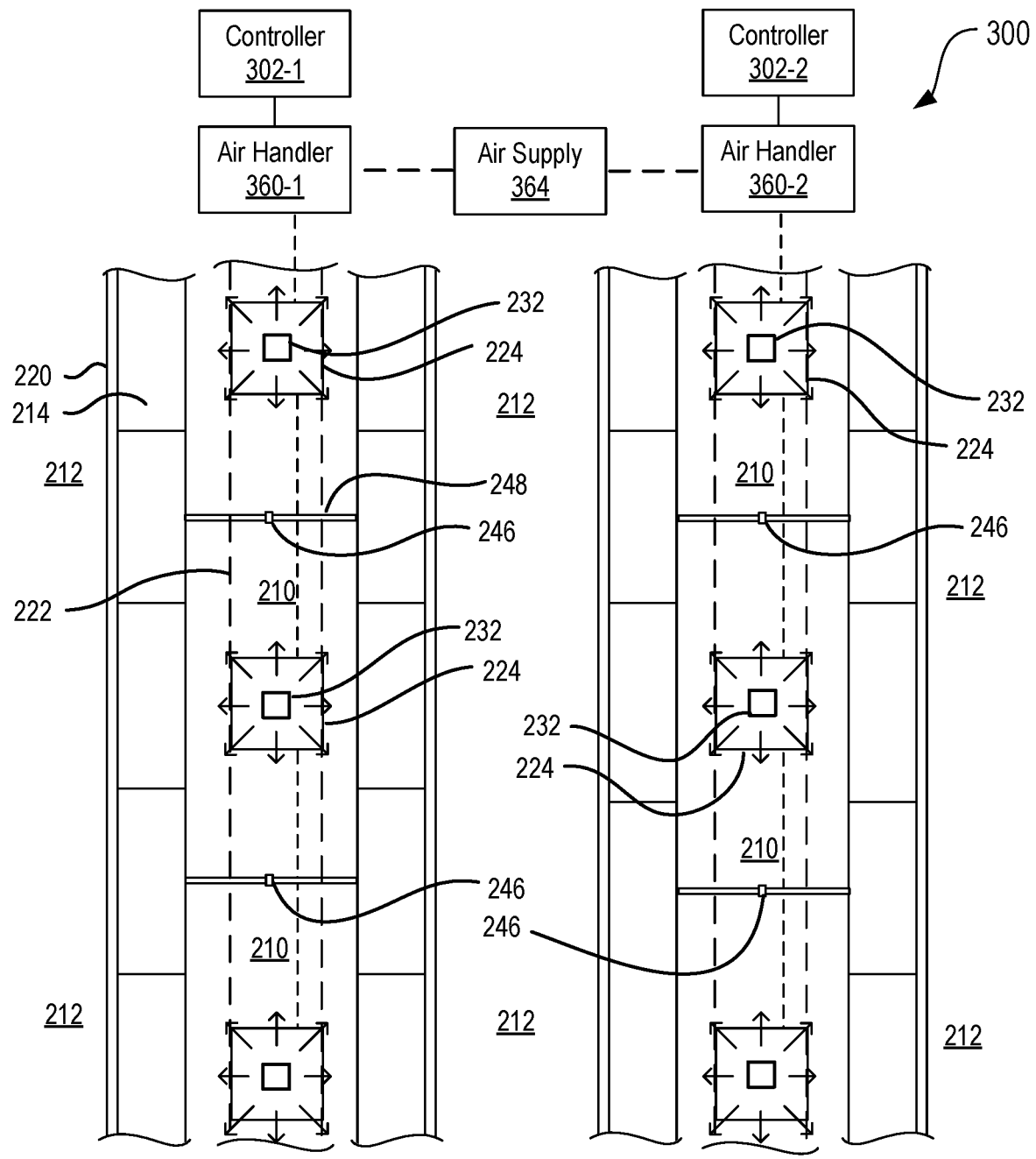
FIG. 3 is a top view diagrammatic illustration of the example of FIG. 2.

The cold air region 210 is supplied with a flow of cold air 238 by the cold air duct 222, which outputs the flow of cold air at the cold air duct outlet 224. In some embodiments, the cold air duct outlets 224 can include cold air duct dampers 226 for locally controlling the flow of cold air 238, e.g., by way of a damper controller 228 and actuator 230. In various embodiments, multiple cold air duct outlets 224 are positioned along a cold aisle at regular intervals, as shown in FIG. 3, and the elements described herein may appear at each or at any number of the cold air duct outlets.

In accordance with various embodiments, a hot air bypass duct 232 is positioned within the cold air duct outlet 224 and passes through the cold air duct 222 between the hot region 212 and cold region 210. The hot air bypass duct 232 includes a hot air bypass inlet 234 fluidly connected with the hot region 212, and a hot air bypass outlet 236 fluidly connected with the cold region 210, in order to allow air to flow through the bypass duct between the two regions. In operation, when a hot air flow 242 is passing through the bypass duct 232 to the cold region 210, the hot air flow mixes with the cold air flow 238. An outer mixing boundary 240 downstream of the bypass duct outlet 236 defines an approximate location beyond which the hot air flow 242 and cold air flow 238 are fully mixed, and within which the temperature may fluctuate as the flows mix. An inner mixing boundary 242 defines an approximate location within which the hot air flow 242 has not yet mixed with the cold air flow 238.

In some examples, the cold region sensor(s) 246 are positioned outside of the outer mixing boundary 240, so that the fluctuating temperatures of the mixing region do not impact the sensor. For example, a first cold air sensor 246-1 can be positioned at a height corresponding to the mixing boundary 240 proximate the cold air outlet 226, but offset along a length of the cold region. This positioning is shown in greater detail in FIG. 3. By way of another example, a second cold air sensor 246-2 can be positioned outside the mixing boundary 240 in-plane with the cold air outlet 226. In various embodiments, cold air mixing sensors may be positioned between instances of the cold air outlet 226 along a cold aisle so that the sensors are further removed from any nearby mixing regions. In specific embodiments, the cold aisle temperature sensors can be positioned along a center of the cold region, and generally at a height of at least 2 m (about 6 ft.) on supports 248.

In accordance with various embodiments, the hot air bypass duct 232 contains a backdraft damper 250 which is arranged in the duct and positioned to allow airflow from the hot region 212 to the cold region 210, but to resist airflow from the cold region to the hot region. The backdraft damper 250 can be, for example, a check valve. In some embodiments, the backdraft damper 250 is a flexible element positioned at an angle within the hot air bypass duct 232, and biased with a biasing element 252 such as a spring or the like, so that a flow of cold air from the cold region 210 causes the valve to close, and so that a flow of hot air from the hot region 212 causes the valve to open. In some embodiments, the backdraft damper 250 can include a valve actuator 254 to permit controlled opening or closing of the valve. In some other embodiments, the backdraft damper 250 can include a hot air bypass temperature sensor 256 which can detect the temperature of air in the hot air bypass duct. This temperature, if too low, can be indicative of reversed airflow escaping from the cold region 210 through the hot air bypass duct 232.

FIG. 3 is a top view diagrammatic illustration of a hot aisle/cold aisle system 300 employing elements of system 200. The system 300 includes multiple cold aisles 210 separated by a hot exterior environment 212, which correspond to the cold and hot regions of FIG. 2, respectively. The system 300 includes electronic component racks 214 and containment elements 220 that separate the cold aisle 210 and hot environment 212. The containment elements 220 wrap around their respective cold aisles 220 as shown in FIG. 2, with the hot environment 212 extending above each cold aisle.

Cold air outlets 224 are shown in conjunction with cold air ducts 222, which run the length of each cold aisle 210. The cold air outlets 224 are positioned at intervals and output a flow of cold air into each cold aisle 210. Hot air bypass ducts 232 are associated with each of the cold air outlets 224, and extend through the cold air ducts 222 at each of the cold air outlets 224, so that hot air passing into the cold aisles 210 through the hot air bypass ducts 232 mixes with the cold air supplied at each of the cold air outlets 224. In some embodiments, the cold air outlets 224 and associated hot air bypass ducts 232 are located at intervals.

The cold region temperature sensors 246 are positioned within the cold aisles 210, typically at sufficient remove from the cold air outlets 224 so as to allow mixing of the cold and warm air before the flow of air encounters the sensors. In some embodiments, the temperature sensors 246 are positioned centrally in the cold aisle 210 and spaced between the cold air outlets 224 along supports 248. The number of cold aisle sensors 246 can vary with the length of the cold aisle 210 and the degree of accuracy to which temperature sensing is desired. In some embodiments, one cold aisle sensor 246 may be positioned centrally along the cold aisle 210. In some other embodiments, multiple cold aisle sensors 246 may be positioned, e.g., two sensors at either end of a cold aisle, three sensors spaced proximate of the ends and centrally in the cold aisle. In some embodiments, sensors 246 can be spaced at regular intervals along the cold aisle 210.

In operation, the cold aisles 210 of the system 300 are managed by one or more controllers, e.g., first aisle controller 302-1 and second aisle controller 302-2, which can communicate with the respective temperature sensors 246 of each aisle and increase or decrease the rate at which cold air is supplied to the aisles based on the measured temperatures. For example, airflow to each cold aisle 210 may be adjusted separately by first and second air handlers 360-1, 360-2, or may be adjusted by a common air supply or building supply 364. In some embodiments, individual cold air outlets 224 may be adjusted for managing local air pressure and air temperature based on local temperature readings within the cold aisles 210.

According to some specific examples, the cold aisles 210 can range in length from about 8 m to about 75 m (about 24 ft. to 250 ft.), and can take in cold airflow from the cold air ducts 222 at rates varying from about 9.4 $m^3s^{-1}$ to about 49 $m^3s^{-1}$ (about 20 k cfm to about 104 k cfm). The hot air bypass ducts 232 can range in dimensions from about 7.5 cm to about 60 cm (about 3 in. to 2 ft.), and in some embodiments are about 30 cm in width. Depending on the desired temperature of the cold aisles 210, the temperature of the hot environment 212, and the temperature of the provided flow of cold air to the cold aisles, the amount of air that flows into the cold aisle can vary. In some cases, the proportion of airflow in the cold aisle originating from the hot air bypass ducts 232 is as little as 5%. In some cases, the contribution of hot air from the bypass ducts 232 ranges from 5% to 33%, or in some cases from 5% to 90%.

Figure 4:
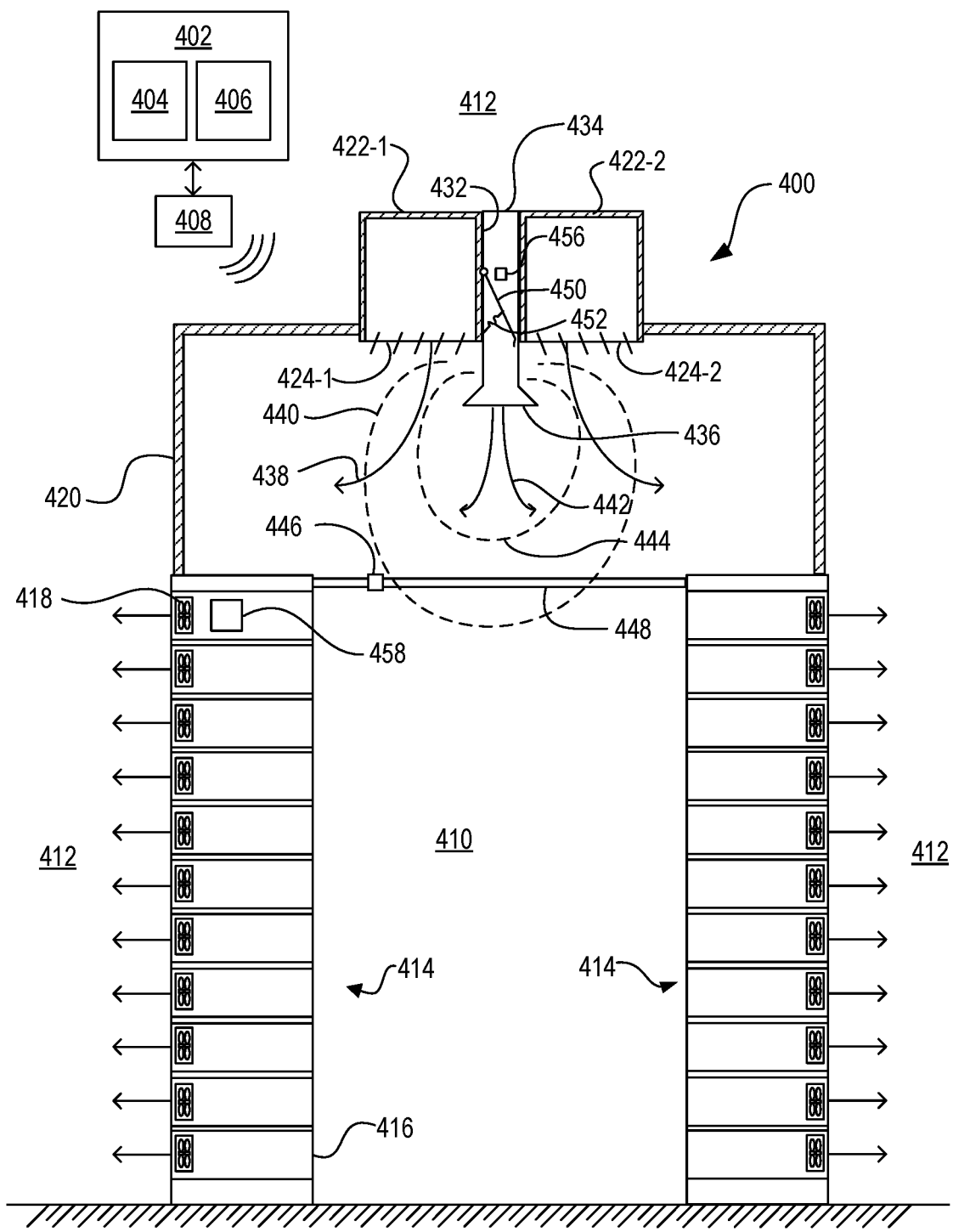
FIG. 4 is a side view diagrammatical illustration of a second example of a contained cold aisle system employing controlled mixing of a cold air supply with a hot air bypass with continuous, elongate cold air outlets separated by a hot air bypass duct.
Figure 5:
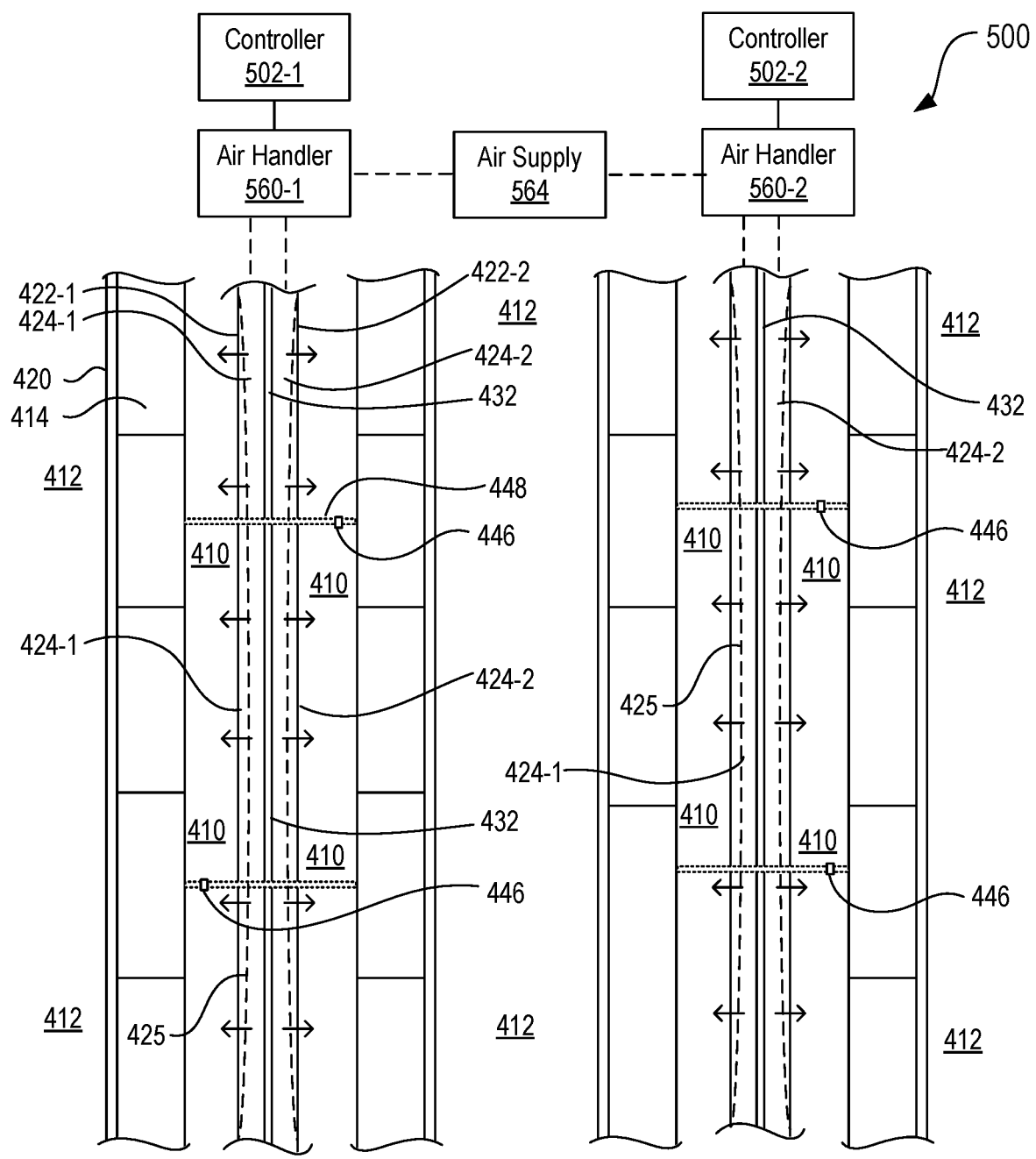
FIG. 5 is a top view diagrammatic illustration of the example of FIG. 4.
Figure 6:
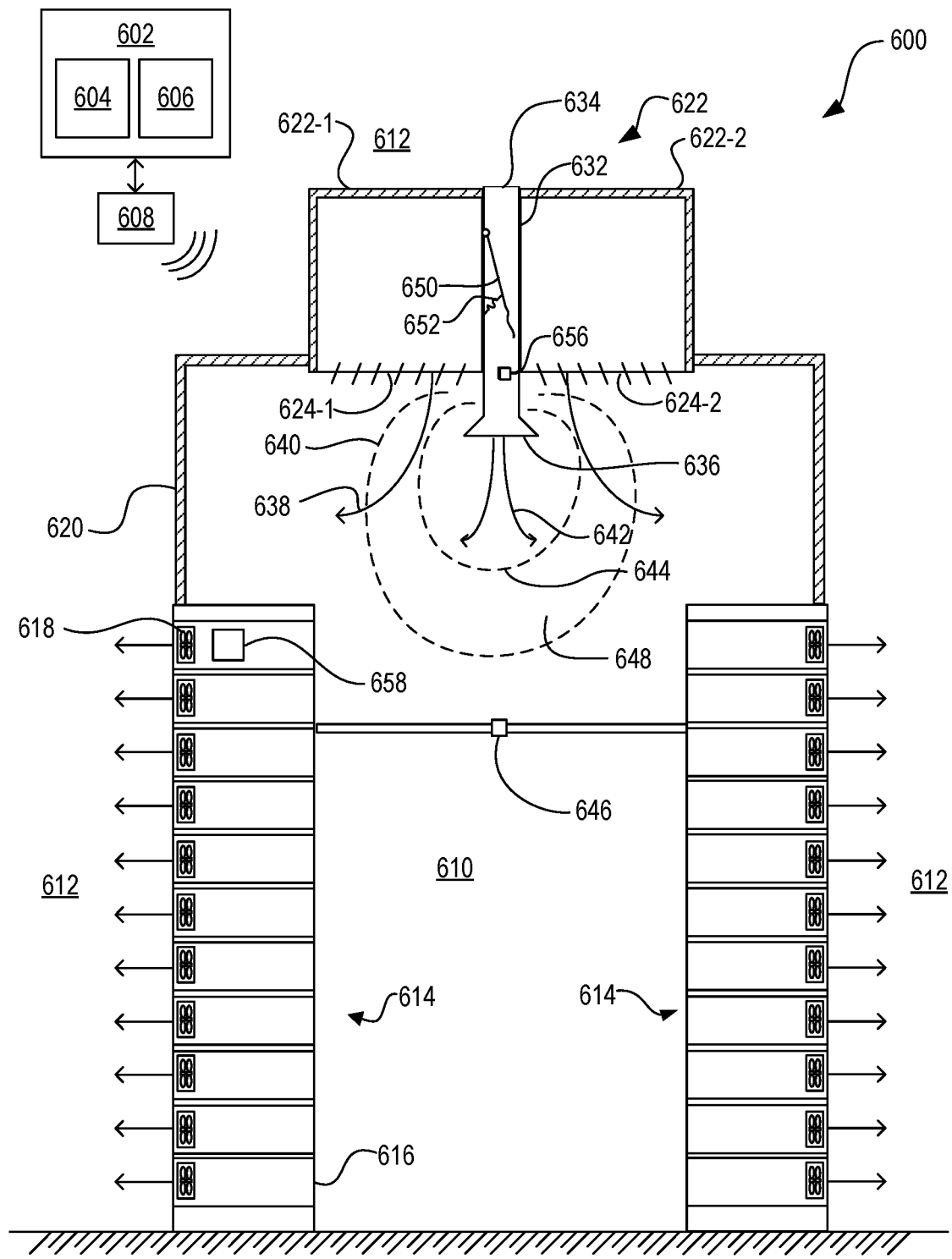
FIG. 6 is a side view diagrammatical illustration of a first example of a contained cold aisle system employing controlled mixing of a cold air supply with a hot air bypass with multiple elongate cold air outlets separated by hot air bypass ducts.
Figure 7:
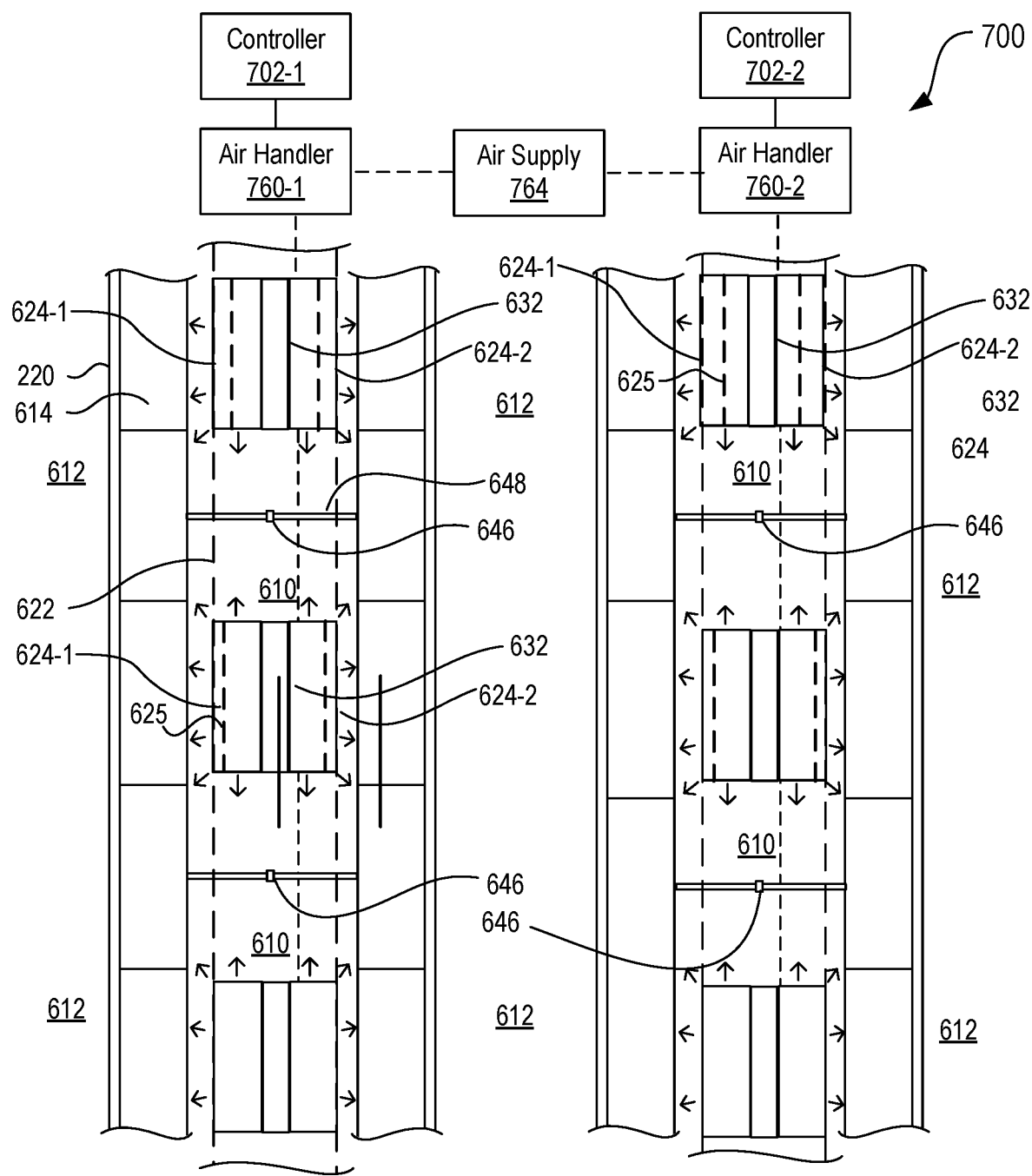
FIG. 7 is a top view diagrammatic illustration of the example of FIG. 6.

Other configurations of the cold air ducts 222 and cold air outlets 224 are within the scope of this disclosure. For example, FIGS. 4-5 show an embodiment of a cooling system in which continuous cold air outlets 424 span a substantial portion of the length of a cold aisle, and FIGS. 6-7 show an embodiment in which multiple pairs of cold air outlets 624 are distributed along a cold aisle. Except where explicitly stated otherwise, analogous elements of each example system may be substituted into one another without deviating from the scope of this disclosure.

FIG. 4 is a side view diagrammatical illustration of an example of a hot aisle/cold aisle system 400 employing a hot air bypass duct 432 positioned within a cold air duct outlet 422. The system 400 can include a controller 402 with a processor 404 and memory 406, similar to the controller 102 described above with reference to FIG. 1, and which may communicate with other aspects of the system by way of, e.g., network 408.

In accordance with various embodiments, the system 400 includes a cold region 410 separated from a hot region 412 by an electronic component rack 414 and containment element 420, similar to the system 200 shown above with reference to FIG. 2. In some embodiments, the cold region 410 is a cold aisle, and the hot region 412 is a hot external environment around the cold aisle. In operation, cold air is passed from the cold region 410, through the individual electronic components 416, and exhausted into the hot region 412 from which it is ultimately removed from the system. The electronic components 416 can include fans 418 for controlling the rate of airflow immediately across each component, and the cold region 410 is pressurized to promote airflow across the electronic components. In some embodiments, the electronic components 416 can include electronic component temperature sensors 458 for detecting local temperatures at the components, which can be used for determining whether a set airflow condition of the system is providing sufficient cooling to the electronic components.

The system 400 differs from the previously described system in particular with reference to a pair of cold air ducts 422, including a first duct 422-1 and second duct 422-2 that are separated from each other. The cold air ducts 422 include cold air duct outlets 424, including a first duct outlet 424-1 and a second duct outlet 424-2 that are separated from each other, and continuous along at least a portion of a length of the cold aisle 410. In some cases, these duct outlets 424 can extend for approximately the entire length of the cold air ducts 422 within the cold region 410, or can extend for portions of that length, e.g., for 50% or more of the duct length.

In accordance with various embodiments, a hot air bypass duct 432 can pass between the first and second cold air ducts 422-1, 422-2, allowing a flow of hot air from the external environment between the ducts. The bypass duct 432 can take the form of a continuous or semi-continuous (i.e., sectioned by periodic supports or the like) gap between the cold air ducts 422-1, 422-2, with a width on the order of 7.5 cm up to about 60 cm. A hot air bypass inlet 434 spans a superior surface of the assembly of the two cold air ducts 422-1, 422-2 to allow hot air into the bypass duct 432, and a hot air bypass outlet 436 is positioned within the cold region 210 for discharging a hot air flow 442 between two cold air flows 438 from the duct outlets 424. The arrangement of the cold air duct outlets 424 and hot air bypass outlet 436 allows for rapid mixing of the cold and hot flows of air 348, 442. As the cold air outlets 424 and hot air bypass outlet 436 run a substantial length of the cold region in this and similar embodiments, cold air sensors 446 are positioned at an offset from the center of the cold region 410, and may be positioned along supports 448 at a predetermined height, so as to avoid falling within a mixing region between the inner and outer mixing boundaries 444, 440.

The hot air bypass duct 432 can include an elongate backdraft damper 450 spanning a length of the duct. The valve 450 can include a flexible member positioned at an angle within the bypass duct 432, and positioned to allow airflow from the hot region 412 to the cold region 410, but to resist airflow from the cold region to the hot region. The backdraft damper 450 can be, for example, a check valve. In some embodiments, the backdraft damper 450 is a flexible element positioned at an angle within the hot air bypass duct 432, and biased with a biasing element 452 such as a spring or the like, so that a flow of cold air from the cold region 410 causes the valve to close, and so that a flow of hot air from the hot region 412 causes the valve to open. In some embodiments, the backdraft damper 450 can include a valve actuator 454 to permit controlled opening or closing of the valve. In some other embodiments, the backdraft damper 450 can include a hot air bypass temperature sensor 456, or more than one, which can detect the temperature of air in the hot air bypass duct. This temperature, if too low, can be indicative of reversed airflow escaping from the cold region 410 through the hot air bypass duct 432. In some embodiments, the bypass duct 432 can be divided into sections, each section having its own elongate backdraft damper 450.

FIG. 5 is a top view diagrammatic illustration of a hot aisle/cold aisle system 500 employing elements of system 400. The system 500 includes multiple cold aisles 410 separated by a hot exterior environment 412, which correspond to the cold and hot regions of FIG. 4, respectively. The system 500 includes electronic component racks 414 and containment elements 420 that separate the cold aisle 410 and hot environment 412. The containment elements 420 wrap around their respective cold aisles 420 as shown in FIG. 4, with the hot environment 412 extending above each cold aisle.

Cold air outlets 424 are shown in conjunction with pairs of cold air ducts 422-1, 422-2, which run the length of each cold aisle 410. The cold air outlets 424-1, 424-2 run a length of the cold air ducts 422 within each cold aisle 410, and output a flow of cold air into each cold aisle. In some embodiments, the cold air outlets 424 may run a partial length of the cold aisle instead, e.g., at least 50% of the length of the cold aisle. Elongate air bypass ducts 432 are associated with each of the cold air ducts 422, and pass between the adjacent cold air ducts 422-1, 422-2, so that hot air passing into the cold aisles 410 through each hot air bypass duct 432 mixes with the cold air supplied at each of the cold air outlets 424-1, 424-2. The cold region temperature sensors 446 are positioned within the cold aisles 410, typically offset from the center of the cold aisles so that airflow from the cold air outlets 424 and bypass ducts 432 mix before the flows of air encounter the sensors. In some embodiments, the cross-sectional area of the cold air outlets 424 can vary along a length of the cold aisles 410 according to a varying area profile 425. The profile 425 corresponds to a dimension of the cold air outlets 424 as a function of distance along the cold aisles 410, and is generally shaped to promote even distribution of cold air along the cold aisles. In at least one embodiment, the profile 425 corresponds to a width of the cold air outlets 424. Suitable profiles can include a widening profile 425, for example, where the cold air outlets 424 near the air handlers 560 are wider than those distal from the air handlers. In some embodiments, the profile narrows and widens, e.g., in an hourglass shape along the cold aisles 410. Specific profiles may differ depending on the relative contributions of duct pressure losses, stagnation, and recirculation to influence flow rate at any given location along the duct 422. In some embodiments, the profile 425 corresponds to a dimension of the ducts 422, which can also change in size over the length of the cold aisles 410.

In operation, the cold aisles 410 of the system 500 are managed by one or more controllers, e.g., first aisle controller 502-1 and second aisle controller 502-2, which can communicate with the respective temperature sensors 446 of each aisle and increase or decrease the rate at which cold air is supplied to the aisles based on the measured temperatures. For example, airflow to each cold aisle 410 may be adjusted separately by first and second air handlers 560-1, 560-2, or may be adjusted by a common air supply or building supply 564.

FIG. 6 is a side view diagrammatical illustration of an example of a hot aisle/cold aisle system 600 employing a hot air bypass duct 632 positioned within a cold air duct outlet 622. The system 600 can include a controller 602 with a processor 604 and memory 606, similar to the controller 102 described above with reference to FIG. 1, and which may communicate with other aspects of the system by way of, e.g., network 608.

In accordance with various embodiments, the system 600 includes a cold region 610 separated from a hot region 612 by an electronic component rack 614 and containment element 620, similar to the system 200 shown above with reference to FIG. 4. In some embodiments, the cold region 610 is a cold aisle, and the hot region 612 is a hot external environment around the cold aisle. In operation, cold air is passed from the cold region 610, through the individual electronic components 616, and exhausted into the hot region 612 from which it is ultimately removed from the system. The electronic components 616 can include fans 618 for controlling the rate of airflow immediately across each component, and the cold region 610 is pressurized to promote airflow across the electronic components. In some embodiments, the electronic components 616 can include electronic component temperature sensors 658 for detecting local temperatures at the components, which can be used for determining whether a set airflow condition of the system is providing sufficient cooling to the electronic components.

The system 600 differs from the previously described systems in particular with reference to a pair of cold air ducts 622, including a first duct 622-1 and second duct 622-2, with intermittently spaced pairs of cold air outlets 424-1, 424-2 that are separated by intermittently spaced hot air bypass ducts 432. The cold air ducts 622-1, 622-2 include cold air duct outlets 624, including a first duct outlet 624-1 and a second duct outlet 624-2 that are separated from each other. In some alternative embodiments, the cold air ducts 622-1, 622-2 can instead include a single cold air duct that is bifurcated only at the locations of each pair of cold air outlets 624-1 and 624-2.

In accordance with various embodiments, the hot air bypass ducts 632 can pass between the first and second cold air ducts 622-1, 622-2, at the locations of each pair of cold air outlets 624-1, 624-2, allowing a flow of hot air from the external environment between the cold air duct outlets. Each bypass duct 632 can take the form of an elongate gap between the cold air ducts 622-1, 622-2, with a width on the order of 7.5 cm up to about 60 cm. A hot air bypass inlet 634 spans is fluidly connected with the hot environment 612 to allow hot air into the bypass duct 632, and a hot air bypass outlet 636 is positioned within the cold region 210 for discharging a hot air flow 642 between two cold air flows 638 from the duct outlets 624. The arrangement of the cold air duct outlets 624 and hot air bypass outlet 636 allows for rapid mixing of the cold and hot flows of air 348, 642. Cold air sensors 646 within the cold region 210 can be positioned offset from the cold air outlets 624 along a length of the cold region, e.g. along supports 648 at a predetermined height, so as to avoid falling within a mixing region between the inner and outer mixing boundaries 644, 640, or may be located in line with the cold air outlets but at a vertical remove.

In accordance with various embodiments, the hot air bypass duct 632 contains a backdraft damper 650 which is arranged in the duct and positioned to allow airflow from the hot region 612 to the cold region 610, but to resist airflow from the cold region to the hot region. The backdraft damper 650 can be, for example, a check valve, or any suitable one-way valve for preventing all of or restricting some reverses flow of air from the cold region outward to the hot environment. In some embodiments, the backdraft damper 650 is a flexible element positioned at an angle within the hot air bypass duct 632, and biased with a biasing element 652 such as a spring or the like, so that a flow of cold air from the cold region 610 causes the valve to close, and so that a flow of hot air from the hot region 612 causes the valve to open. In some embodiments, the backdraft damper 650 can include a hot air bypass temperature sensor 656 which can detect the temperature of air in the hot air bypass duct. This temperature, if too low, can be indicative of reversed airflow escaping from the cold region 610 through the hot air bypass duct 632.

FIG. 7 is a top view diagrammatic illustration of a hot aisle/cold aisle system 700 employing elements of system 600. The system 700 includes multiple cold aisles 610 separated by a hot exterior environment 612, which correspond to the cold and hot regions of FIG. 6, respectively. The system 700 includes electronic component racks 614 and containment elements 620 that separate the cold aisle 610 and hot environment 612. The containment elements 620 wrap around their respective cold aisles 620 as shown in FIG. 6, with the hot environment 612 extending above each cold aisle.

Cold air outlets 624-1 and 624-2 are shown positioned along the cold aisle 610 in conjunction with cold air ducts 622-2, 622-2, which run the length of each cold aisle 610. The cold air outlets 624-1, 624-2 are positioned at intervals and in pairs, and output a flow of cold air into each cold aisle 610. Hot air bypass ducts 632 are associated with each of the pairs of cold air outlets 624, and extend between the cold air ducts 622 at each pair of the cold air outlets 624, so that hot air passing into the cold aisles 610 through the hot air bypass ducts 632 mixes with the cold air supplied at each of the cold air outlets 624-1, 624-2. The bypass ducts 632 and cold air duct outlets 624 can be positioned at any suitable interval as described above with reference to duct outlets 224 (FIG. 2). In some embodiments, the cross-sectional areas of the individual cold air outlets 624 can vary along a length of the cold aisles 610 according to a varying area profile 625. As described above with reference to FIG. 5 and system 500, the profile 625 of the ducts 610 corresponds to a dimension of the cold air outlets 624 as a function of distance along the cold aisles 610, and is generally shaped to promote even distribution of cold air along the cold aisles. In at least one embodiment, the profile 625 corresponds to steps in the widths of each individual cold air outlet 624, but in some embodiments where the cold air outlets are elongated, the profile can also correspond to decreasing or increasing widths along each outlet. Suitable profiles can include a widening profile 625, for example, where the cold air outlets 624 near the air handlers 560 are wider than those distal from the air handlers. In some embodiments, the profile narrows and widens, e.g., in an hourglass shape along the cold aisles 610. Specific profiles may differ depending on the relative contributions of duct pressure losses, stagnation, and recirculation to influence flow rate at any given location along the duct 622. In some embodiments, the profile 625 corresponds to a dimension of the ducts 622, which can also change in size over the length of the cold aisles 610.

Varying cold air outlet profiles (e.g. profile 425, 625) as described above with reference to FIGS. 5 and 7 can also be applied with respect to the cold air outlets 224 of FIGS. 2-3. In addition, a relative dimension of the hot air bypass duct(s) (e.g., ducts 232, 432, 632, FIGS. 2-7) can be consistent over the length of each cold aisle (210, 410, 610), or may vary in conjunction with the cold air outlets.

The cold region temperature sensors 646 are positioned within the cold aisles 610, typically at sufficient remove from the cold air outlets 624 so as to allow mixing of the cold and warm air before the flow of air encounters the sensors. In some embodiments, the temperature sensors 646 are positioned centrally in the cold aisle 610 and spaced between the cold air outlets 624 along supports 648.

In operation, the cold aisles 610 of the system 700 are managed by one or more controllers, e.g., first aisle controller 702-1 and second aisle controller 702-2, which can communicate with the respective temperature sensors 646 of each aisle and increase or decrease the rate at which cold air is supplied to the aisles based on the measured temperatures. For example, airflow to each cold aisle 610 may be adjusted separately by first and second air handlers 760-1, 760-2, or may be adjusted by a common air supply or building supply 764. In some embodiments, individual cold air outlets 624 may be adjusted for managing local air pressure and air temperature based on local temperature readings within the cold aisles 610.

Figure 8:
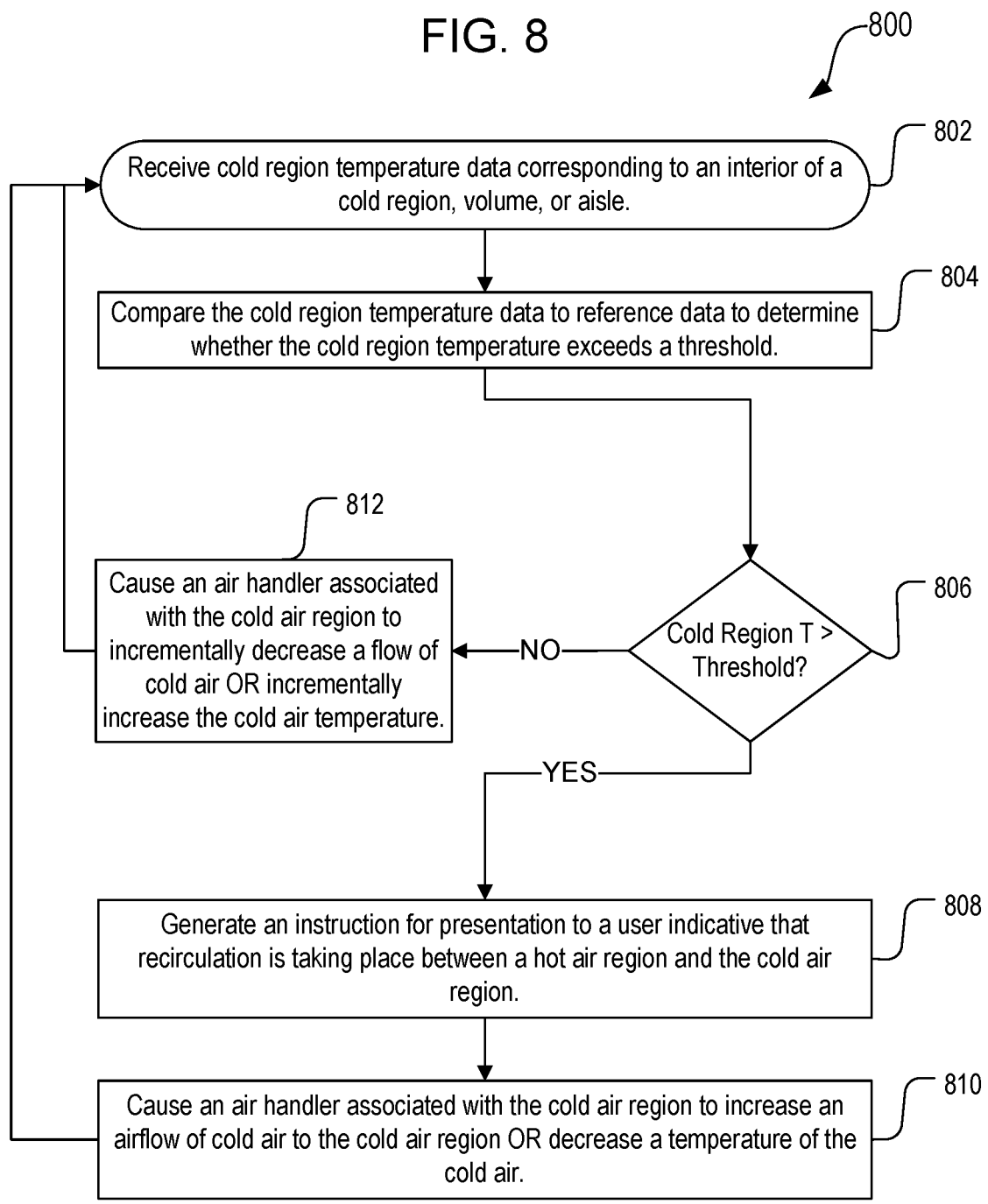
FIG. 8 illustrates a first example process for controlling a cooling system employing controlled mixing of a cold air supply with a hot air bypass with cold air in conjunction with one or more temperature sensors.

FIG. 8 illustrates a first example process 800 for controlling a cooling system employing a hot aisle/cold aisle system or contained cold-aisle system in conjunction with a controlled hot air bypass duct and one or more temperature sensors in the cold aisle, according to various embodiments. Steps shown in the example process 800 can be implemented in accordance with systems for cooling one or more electronic components, for example as shown in systems 100-700 of FIGS. 1-7. In particular, the process 800 relates to detecting a temperature in the cold aisle and adjusting a flow rate of cold air to the cold aisle based on the detected temperature.

In accordance with various embodiments, a cooling system can receive cold region temperature data corresponding to an interior of a cold region, volume, or aisle (act 802). The system can then compare the cold region temperature data to reference data to determine whether the cold region temperature exceeds a threshold (act 804). The threshold can be set based on any suitable combination of factors including: a target cold aisle temperature, an external, hot environment temperature, a temperature of the air supply available for cooling, or similar. For example, for a target cold aisle temperature range of about 83° C. to 87° C., a threshold temperature may be set within the target temperature range (e.g., 85° C.).

If the temperature in the cold region does not exceed the threshold (act 806), the system can either resume monitoring, or can incrementally decrease the flow rate of cold air (act 812). Alternatively, the system can relax secondary cooling or air conditioning, if applicable, and allow a temperature of the cold air to incrementally increase. Such measures can be used to provide active airflow management so that energy is not wasted excessively pressurizing or cooling the cold region.

If the temperature in the cold region does exceed the threshold (act 806), then the system can generate an instruction for presentation to a user indicative that recirculation is taking place between the hot air region and the cold air region (act 808), and can take corrective actions. For example, the system can cause the air handler associated with the cold air region to increase the rate of airflow to the cold air region (act 810). In some embodiments, the system can also, or alternatively, cause a decrease in the temperature of the cold air. The system can monitor the temperature of air in the cold region periodically or continuously in order to provide for continuous and adaptive control over the airflow to the cold aisle.

Figure 9:
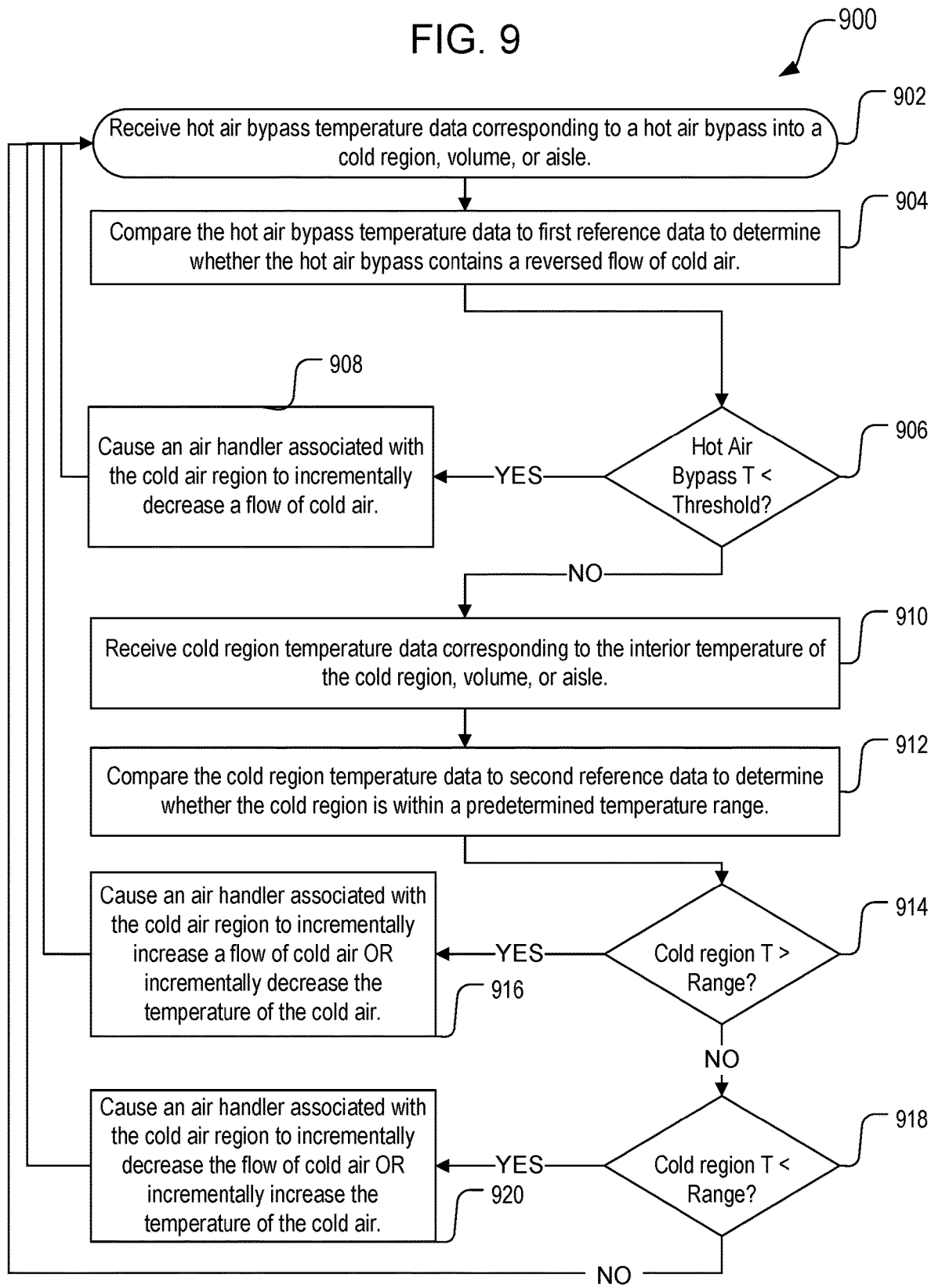
FIG. 9 illustrates a second example process for controlling a cooling system.

FIG. 9 illustrates a second example process 900 for controlling a cooling system employing a hot aisle/cold aisle system or contained cold-aisle system in conjunction with a controlled hot air bypass duct and one or more temperature sensors in the cold aisle, according to various embodiments. Steps shown in the example process 900 can be implemented in accordance with systems for cooling one or more electronic components, for example as shown in systems 100-700 of FIGS. 1-7. In particular, the process 900 relates to detecting reversed flow in the bypass, and to detecting a temperature in the cold aisle and comparing the temperature to a range in order to determine whether to increase or decrease the flow rate of cold air.

In accordance with various embodiments, a cooling system can receive hot air bypass temperature data corresponding to a hot air bypass into a cold region, volume, or aisle (act 902). The system can then compare the hot air bypass temperature data to first reference data to determine whether the hot air bypass duct contains a reversed flow of cold air (act 904). Reversed flow can be detected, e.g., by detecting that an airflow temperature in the hot air bypass falls below a threshold (act 906), such as a temperature between that of the hot exterior environment and target cold region temperature. A reversed flow of cold air at the hot air bypass duct can indicate, for example, excessive overpressure in the cold aisle or failure in a backdraft damper of the hot air bypass duct. In some embodiments, the system can provide an indication for presentation to a user, such as a warning, indicative of the reversed flow state. In some embodiments, the system can respond to the reversed flow state by causing an air handler to decrease the flow rate of cold air to the cold region (act 908) and can resume monitoring.

If reversed flow is not detected (act 906), the system can receive cold region temperature data corresponding the flow of air within the cold region (act 910). The cold region temperature can be compared to cold aisle reference data to determine whether the temperature in the cold region falls within a reference cold region temperature range (act 912). If the cold region temperature exceeds the range (act 914), the system can determine that recirculation has occurred from the hot air bypass duct indicative of underpressure in the cold region, and can cause an air handler associated with the cold region to incrementally increase the flow of cold air (act 916). If the cold air temperature falls below the temperature range (act 918), the system can determine that minimal or no recirculation is occurring, indicative of overpressure in the cold region, and can cause an air handler associated with the cold region to incrementally decrease the flow of cold air (act 920). If the cold air temperature range falls within the reference range (act 918). the system can determine that sufficient cold air is flowing to the cold region to provide effective cooling without overpressure, and may resume monitoring without effecting any immediate changes to the airflow.

In some embodiments, the reference temperature range used for monitoring the cold region temperature may be periodically adjusted. For example, the temperature range may be periodically increased by a set among in order to increase the energy efficiency of the system, and alternative criteria may be used to determine whether the elevated temperatures are suitable for long-term use. For example, temperature sensors positioned at or on the electronic devices to be cooled may be used as a basis for assessing whether the increased temperatures of the cold region are sufficiently low to provide adequate cooling. Alternatively, the temperature range may be periodically decreased. In alternative embodiments, the temperature of the supply of cold air may be increased or decreased in conjunction with, or instead of, increasing or decreasing the flow rate of the flow of cold air.

Figure 10:
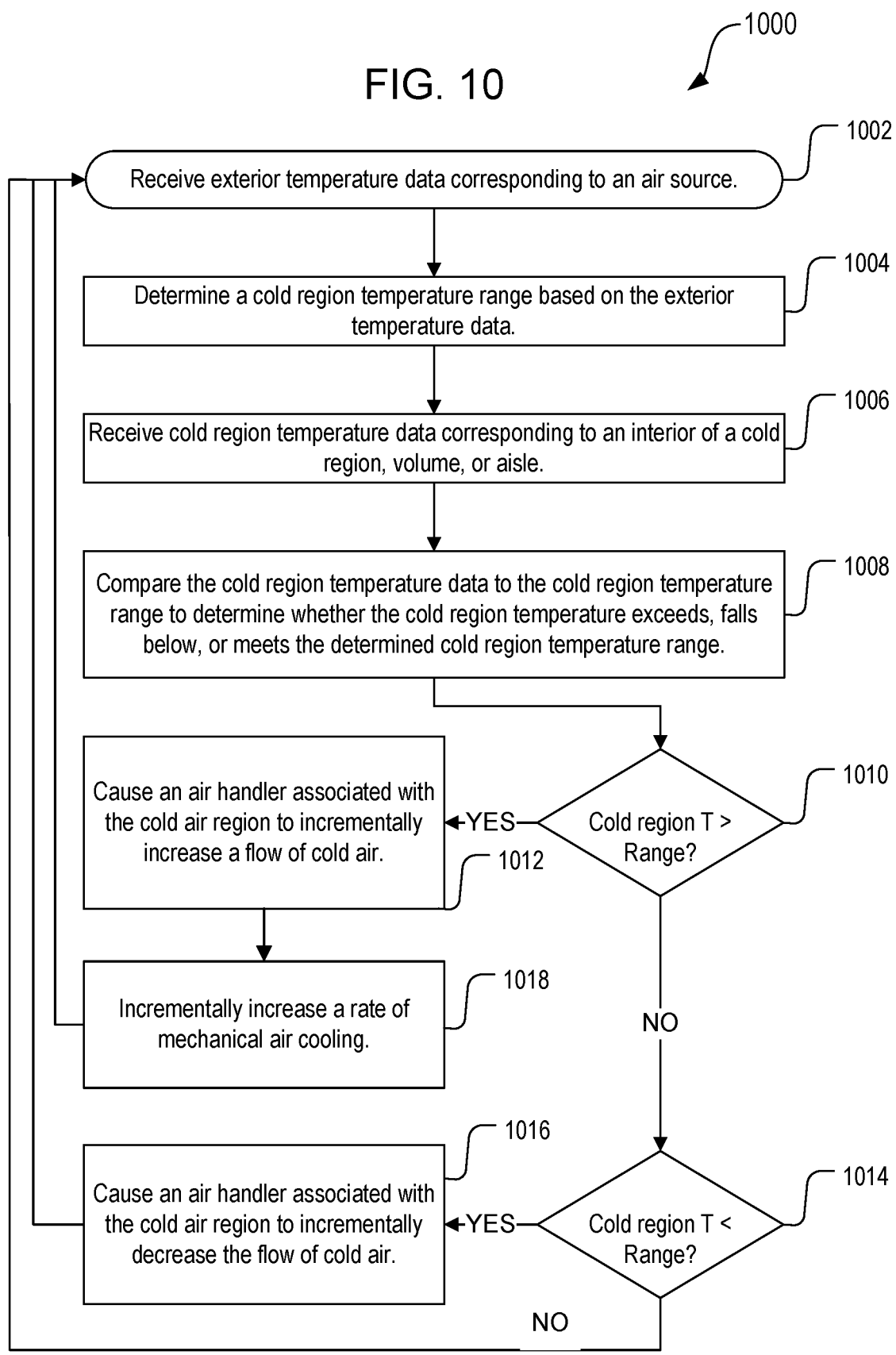
FIG. 10 illustrates a third example process for controlling a cooling system.

FIG. 10 illustrates a third example process 1000 for controlling a cooling system employing a hot aisle/cold aisle system or contained cold-aisle system in conjunction with a controlled hot air bypass duct and one or more temperature sensors in the cold aisle, according to various embodiments. Steps shown in the example process 1000 can be implemented in accordance with systems for cooling one or more electronic components, for example as shown in systems 100-700 of FIGS. 1-7. In particular, the process 1000 relates to setting a reference temperature range based on exterior temperature data, and to comparing a temperature in the cold region to a the reference range in order to determine whether to increase or decrease the flow rate of cold air to the cold region.

In accordance with various embodiments, exterior temperature data can be received that corresponds to an air source for the cooling airflow (act 1002). The system can then determine a reference cold aisle temperature range based in part on the exterior temperature data (act 1004). For example, for a particular nominal exterior temperature, the cold aisle temperature range may be set to about 83° C. to 87° C. However, if the external temperature is high, or if the available supply of cooling air is relatively warm, the target cold aisle temperature may be increased in order to preserve efficiency. If the available supply of cooling air is relatively cold, likewise, the target temperature range may be decreased.

The system can receive cold region temperature data corresponding to an interior of the cold region (act 1006), and then in a process similar to those discussed above, compare the cold region temperature data to the cold region temperature range to determine whether the cold region temperature exceeds, falls below, or meets the determined cold region temperature range (act 1008). If the cold region temperature exceeds the range (act 1010), the system can cause an air handler associated with the cold air region to incrementally increase the flow of cold air (act 1012). Conversely, if the cold region temperature falls below the temperature range (act 1014), the system can incrementally decrease the flow of cold air (act 1016). If the cold region temperature is within the target range, the system can return to monitoring the temperatures of the exterior environment, air source, and/or cold air region without effecting immediate changes. In some embodiments, as in datacenters located in hot climates, mechanical air cooling (i.e., air condition) may be needed to bring the air source within a range of temperatures suitable for use in the cooling system. In such environments, the system can also adjust the rate of mechanical cooling in conjunction with adjusting the airflow rate when the cold environment's temperature is above the temperature range (act 1018). Conversely, the system can decrease the rate of mechanical cooling when the cold environment's temperature is within or below a target temperature range.

FIG. 11 illustrates a fourth example process 1100 for controlling a cooling system employing a hot aisle/cold aisle system or contained cold-aisle system in conjunction with a controlled hot air bypass duct and one or more temperature sensors in the cold aisle, according to various embodiments. Steps shown in the example process 1100 can be implemented in accordance with systems for cooling one or more electronic components, for example as shown in systems 100-300, and 600-700 of FIGS. 1-3 and 6-7. In particular, the process 1100 relates to detecting temperatures within the cold region, comparing the temperatures to reference data, and adjusting local airflow rates within the cold region.

In a process similar to those discussed above, the system can receive cold region temperature data corresponding to a location at an interior of a cold region, volume, or aisle (act 1102). The system can then compare the cold region temperature data to reference data to determine whether the cold region temperature falls within, exceeds, or falls below a reference range (1104), and if the temperature is within the range (act 1106), can resume monitoring. If the cold region temperature falls outside of the range (act 1106), the system can identify a local cold air outlet associated with the cold region temperature data (act 1108), for example, based on a location of a cold aisle sensor corresponding to the cold region temperature data. The system may then locally adjust a flow rate of cold air at the identified cold air outlet. For example, when the cold region temperature exceeds the reference temperature range (act 1110), the system can cause the associated cold air outlet to incrementally increase local cold air flow (act 1112). When the cold region temperature falls below the reference temperature range (act 1114), the system can cause the associated cold air outlet to incrementally decrease local cold air flow (act 1116). Local increases and decreases in airflow can be achieved by, e.g., increasing or decreasing the total flow of cold air to a cold air supply duct associated with the local cold air outlet, and/or adjusting one or more outlet dampers or valves associated with the local cold air outlet.

Some or all of the processes 800, 900, 1000, or 1100 (or any other processes described herein, or variations, and/or combinations thereof) may be performed under the control of one or more computer systems configured with executable instructions and may be implemented as code (e.g., executable instructions, one or more computer programs, or one or more applications) executing collectively on one or more processors, by hardware or combinations thereof. The code may be stored on a computer-readable storage medium, for example, in the form of a computer program comprising a plurality of instructions executable by one or more processors. The computer-readable storage medium may be non-transitory.

Various computing environments may be used, as appropriate, to implement various embodiments as described herein including web- or cloud-based computing environments, computing environments based on local controllers, or combinations of the above. User or client devices can include any of a number of general purpose personal computers, such as desktop or laptop computers running a standard operating system, as well as cellular, wireless and handheld devices running mobile software and capable of supporting a number of networking and messaging protocols. Such an environment also can include a number of workstations running any of a variety of commercially-available operating systems and other known applications for purposes such as development and database management. These workstations also can include other electronic devices, such as dummy terminals, thin-clients, gaming systems and other devices capable of communicating via a network and used for communicating with sensors, displays, actuators, and user interfaces, among other devices.

For example, user interfaces (such as interface 162, FIG. 1) can include any appropriate device operable to send and receive requests, messages, or information over an appropriate network and convey information back to a user of the device. Examples of such devices include portable displays, personal computers, cell phones, handheld messaging devices, laptop computers, set-top boxes, personal data assistants, electronic book readers, and the like. The network can include any appropriate network, including an intranet, the Internet, a cellular network, a local area network, or any other such network or combination thereof. Components used in conjunction with such a network can depend at least in part upon the type of network and/or environment selected. Protocols and components for communicating via such a network are well known and will not be discussed herein in detail. Communication over the network can be enabled by wired or wireless connections and combinations thereof.

Suitable computing environments can include, in various embodiments, a server and data store. It should be understood that there can be several servers, layers, or other elements, processes, or components, which may be chained or otherwise configured, which can interact to perform tasks such as obtaining data, processing said data, and communicating data or with users. For example, according to various embodiments, a controller such as controller 102 (FIG. 1) can include a server and/or a virtual machine emulated by a server. As used herein the term "data store" refers to any device or combination of devices capable of storing, accessing, and retrieving data, which may include any combination and number of data servers, databases, data storage devices, and data storage media, in any standard, distributed, or clustered environment. The server can include any appropriate hardware and software for integrating with the data store as needed to execute aspects of one or more applications for the client device, handling a majority of the data access and logic for an application. The server provides access control services in cooperation with the data store and is able to generate content such as text, graphics, audio, and/or video to be transferred to the user, which may be served to the user by the Web server in the form of HyperText Markup Language ("HTML"), Extensible Markup Language ("XML"), or another appropriate structured language in this example. It should be understood that servers are not required and are merely example components, as structured code discussed herein can be executed on any appropriate device or host machine as discussed elsewhere herein.

The data store can include several separate data tables, databases or other data storage mechanisms and media for storing data relating to a particular aspect. For example, the data store can include a mechanism for storing data for reporting, analysis, or other such purposes. The data store is operable, through logic associated therewith, to receive instructions and obtain, update or otherwise process data in response thereto.

Each server typically will include an operating system that provides executable program instructions for the general administration and operation of that server and typically will include a computer-readable storage medium (e.g., a hard disk, random access memory, read only memory, etc.) storing instructions that, when executed by a processor of the server, allow the server to perform its intended functions. Suitable implementations for the operating system and general functionality of the servers are known or commercially available and are readily implemented by persons having ordinary skill in the art, particularly in light of the disclosure herein.

A computing environment according to various embodiments can be a distributed computing environment utilizing several computer systems and components that are interconnected via communication links, using one or more computer networks or direct connections. However, it will be appreciated by those of ordinary skill in the art that the embodiments discussed above could operate equally well in a computing environment having fewer or a greater number of components, including systems operated under the control of a single computing device in communication with any suitable combination of the various sensors, input/output devices and/or actuators discussed herein.

Most embodiments utilize at least one network that would be familiar to those skilled in the art for supporting communications using any of a variety of commercially-available protocols, such as Transmission Control Protocol/Internet Protocol ("TCP/IP"), Open System Interconnection ("OSI"), File Transfer Protocol ("FTP"), Universal Plug and Play ("UpnP"), Network File System ("NFS"), Common Internet File System ("CIFS"), and AppleTalk®. The network can be, for example, a local area network, a wide-area network, a virtual private network, the Internet, an intranet, an extranet, a public switched telephone network, an infrared network, a wireless network, and any combination thereof.

In embodiments utilizing a Web server, the Web server can run any of a variety of server or mid-tier applications, including Hypertext Transfer Protocol ("HTTP") servers, FTP servers, Common Gateway Interface ("CGI") servers, data servers, Java servers, and business application servers. The server(s) also may be capable of executing programs or scripts in response to requests from user devices, such as by executing one or more Web applications that may be implemented as one or more scripts or programs written in any programming language, such as Java®, C, C#, or C++, or any scripting language, such as Perl, Python, or TCL, as well as combinations thereof. The server(s) may also include database servers, including without limitation those commercially available from Oracle®, Microsoft®, Sybase®, and IBM®.

Computing environments as discussed herein can include a variety of data stores and other memory and storage media as discussed above. These media can reside in a variety of locations, such as on a storage medium local to (and/or resident in) one or more of the computers or remote from any or all of the computers across the network. In a particular set of embodiments, the information may reside in a storage-area network ("SAN") familiar to those skilled in the art. Similarly, any necessary files for performing the functions attributed to the computers, servers, or other network devices may be stored locally and/or remotely, as appropriate. Where a system includes computerized devices, each such device can include hardware elements that may be electrically coupled via a bus, the elements including, for example, at least one central processing unit ("CPU"), at least one input device (e.g., a mouse, keyboard, controller, touch screen, or keypad), and at least one output device (e.g., a display device, printer, or speaker). Such a system may also include one or more storage devices, such as disk drives, optical storage devices, and solid-state storage devices such as random access memory ("RAM") or read-only memory ("ROM"), as well as removable media devices, memory cards, flash cards, etc.

Suitable media can also include a computer-readable storage media reader, a communications device (e.g., a modem, a network card (wireless or wired)), an infrared communication device, etc.), and working memory as described above. The computer-readable storage media reader can be connected with, or configured to receive, a computer-readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services, or other elements located within at least one working memory device, including an operating system and application programs, such as a client application or Web browser. It should be appreciated that alternate embodiments may have numerous variations from that described above. For example, customized hardware might also be used and/or particular elements might be implemented in hardware, software (including portable software, such as applets), or both. Further, connection to other computing devices such as network input/output devices may be employed.

Storage media computer readable media for containing code, or portions of code, can include any appropriate media known or used in the art, including storage media and communication media, such as but not limited to volatile and non-volatile, removable and non-removable media implemented in any method or technology for storage and/or transmission of information such as computer readable instructions, data structures, program modules, or other data, including RAM, ROM, Electrically Erasable Programmable Read-Only Memory ("EEPROM"), flash memory or other memory technology, Compact Disc Read-Only Memory ("CD-ROM"), digital versatile disk (DVD), or other optical storage, magnetic cassettes, magnetic tape, magnetic disk storage, or other magnetic storage devices, or any other medium which can be used to store the desired information and which can be accessed by a system device. Based on the disclosure and teachings provided herein, a person of ordinary skill in the art will appreciate other ways and/or methods to implement the various embodiments.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A system for controlling airflow, comprising:
   a datacenter comprising a hot environment, a cold aisle adjacent to the hot environment, a containment element separating the hot environment from the cold aisle, a cold air outlet providing a cold flow of air into the cold aisle, and one or more heat-generating electronic devices positioned between the hot environment and the cold aisle configured to take in cold air from the cold aisle and exhaust hot air to the hot environment;
   a hot air bypass duct positioned within a cold air outlet duct and arranged to channel hot air to a mixing region within the cold aisle adjacent the cold air outlet, the hot air bypass duct fluidly connecting the hot environment and the cold aisle to allow hot air to flow from the hot environment to the cold aisle in response to a pressure in the hot environment exceeding a pressure in the cold aisle, an outlet of the hot air bypass duct positioned in the cold aisle proximate to or through the cold air outlet;
   a backdraft damper positioned within the hot air bypass duct and arranged to allow flow of air from the hot environment to the cold aisle and restrict flow of air from the cold aisle to the hot environment;
   a cold aisle temperature sensor positioned within the cold aisle and separated from the cold air outlet, the cold aisle temperature sensor positioned between an inner mixing boundary and outer mixing boundary within which the hot air flowing from the hot environment mixes with the cold flow of air into the cold aisle when the hot air flows through the hot air bypass duct; and
   a controller configured to:
      detect a temperature of the air between the inner and outer mixing boundaries within the cold aisle via the cold aisle temperature sensor; and
      determine, based on the detected temperature, whether a cold aisle pressure in the cold aisle is less than a hot environment pressure in the hot environment.

2. The system of claim 1, further comprising an air handler arranged in fluid connection with the cold air outlet and configured to supply the airflow to the cold aisle through the cold air outlet, wherein the controller is further configured to:
   in response to determining that the cold aisle pressure is less than the hot environment pressure, cause the air handler to increase a flow rate of the airflow to the cold aisle.

3. The system of claim 2, wherein the controller is further configured to:
   in response to detecting that the cold aisle pressure is not less than the hot environment pressure, cause the air handler to decrease the flow rate of the airflow to the cold aisle by an increment.

4. The system of claim 1, further comprising an air handler arranged in fluid connection with the cold air outlet and configured to supply the airflow to the cold aisle through the cold air outlet, wherein the controller is further configured to:
  compare the temperature of the air within the cold aisle to a temperature range;
  in response to detecting that the temperature of the air within the cold aisle exceeds the temperature range, cause the air handler to increase a flow rate of the airflow to the cold aisle; and
  in response to detecting that the temperature of the air within the cold aisle is less than the temperature range, cause the air handler to decrease the flow rate of the airflow to the cold aisle.

5. The system of claim 1, further comprising a bypass temperature sensor positioned in the hot air bypass duct for detecting a bypass air temperature, wherein the controller is further configured to:
  compare the bypass air temperature with a reference temperature; and
  determine, based on the bypass air temperature, a direction of flow of the air through the hot air bypass duct.

6. The system of claim 1, further comprising first and second cold air ducts that include the cold air duct, and first and second elongate cold air outlets including the cold air outlet, wherein:
  the first and second cold air ducts are spaced apart from each other and run at least a portion of a length of the cold aisle;
  the first and second elongate outlets correspond, respectively, to the first and second cold air ducts and are open to the cold aisle along the portion of the length of the cold aisle;
  the hot air bypass duct comprises an elongate channel separating the first and second cold air ducts; and
  the backdraft damper comprises an elongate flexible member arranged in the elongate channel.

7. The system of claim 1, further comprising first and second cold air ducts that include the cold air duct, and a plurality of cold air outlets including the cold air outlet, wherein:
  the first and second cold air ducts are spaced apart from each other and run at least a portion of a length of the cold aisle;
  the plurality of cold air outlets comprise a plurality of pairs of first and second cold air outlets corresponding, respectively, to the first and second cold air ducts, the pairs positioned at intervals of length along the first and second cold air ducts;
  the hot air bypass duct comprises an elongate channel separating a pair of the first and second outlets; and
  the backdraft damper comprises an elongate flexible member arranged in the elongate channel.

8. A cold air outlet assembly, comprising:
  a containment element defining a cold region and arranged to separate the cold region from a hot environment;
  a cold air outlet arranged in the cold region for providing a flow of cold air to the cold region;
  a cold air duct fluidly connected with the cold air outlet and configured for providing the flow of cold air to the cold air outlet;
  a hot air bypass duct positioned within a cold air outlet duct and arranged to channel hot air to a mixing region within the cold region adjacent the cold air outlet, the hot air bypass duct fluidly connecting the hot environment and the cold region to allow hot air to flow from the hot environment to the cold region in response to a pressure in the hot environment exceeding a pressure in the cold region, the hot air bypass duct having a bypass inlet outside the cold region and a bypass outlet positioned in the cold region proximate to or through the cold air outlet of the cold air duct;
  a backdraft damper positioned within the hot air bypass duct and arranged to allow the hot air to flow from the hot environment to the cold region and to restrict cold air from flowing from the cold region to the hot environment through the hot air bypass duct; and
  a temperature sensor positioned in the cold region between an inner mixing boundary and outer mixing boundary within which the hot air flowing from the hot environment mixes with the cold flow of air into the cold region when the hot air flows through the hot air bypass duct, the temperature sensor configured to detect a temperature of a mixed flow of the cold air flowing from the cold air duct and the hot air flowing from the hot air bypass duct.

9. The cold air outlet assembly of claim 8, wherein:
  the cold region is a cold aisle; and
  the temperature sensor in the cold region is positioned at a vertical height of at least 2 m from a floor of the cold region and along an aisle centerline.

10. The cold air outlet assembly of claim 8, wherein:
  the hot air bypass duct passes through the cold air duct from outside the cold region and through the cold air outlet; and
  the bypass outlet of the hot air bypass duct is positioned in the cold region downstream of the cold air outlet in a direction of the flow of cold air to the cold region.

11. The cold air outlet assembly of claim 8, wherein the cold air duct is a first cold air duct and the cold air outlet is a first cold air outlet, and further comprising a second cold air duct and a second cold air outlet, wherein:
  the first and second cold air ducts are spaced apart from each other and run at least a portion of a length of the cold region;
  the first and second cold air outlets are elongate outlets corresponding, respectively, to the first and second cold air ducts and open to the cold region along the portion of the length of the cold region;
  the hot air bypass duct comprises an elongate channel separating the first and second cold air ducts along the portion of the length of the cold region; and
  the backdraft damper comprises an elongate flexible member arranged in the elongate channel.

12. The cold air outlet assembly of claim 8, wherein the cold air duct is a first cold air duct, the assembly further comprising:
  a second cold air duct that runs a portion of a length of the cold region in parallel with the first cold air duct;
  a plurality of aligned pairs of first cold air outlets and second cold air outlets, including the cold air outlet, the pairs of cold air outlets positioned at intervals along the first and second cold air ducts; and
  a plurality of hot air bypass ducts including the hot air bypass duct, each hot air bypass duct positioned between and separating a respective pair of the pairs of first and second cold air outlets.

13. The cold air outlet assembly of claim 8, wherein the backdraft damper comprises a flexible member and a biasing element arranged to bias the backdraft damper closed across the hot air bypass duct when the backdraft damper is subjected to a pressure difference of zero.

14. The cold air outlet assembly of claim 8, further comprising a plurality of cold air outlets, one of the plurality being the cold air outlet, wherein a dimension of the plurality of cold air outlets increases or decreases according to a pressure change over a distance in the cold air duct.

15. The cold air outlet assembly of claim 8, wherein the hot air bypass duct has a width in a range of 7.5 cm to 60 cm.

16. A method, comprising:
in a contained cold region separated from a hot environment of a datacenter by a containment element, the cold region fluidly connected with a cold air outlet providing a flow of cold air to the cold region and fluidly connected with a hot air bypass duct that is positioned within a cold air outlet duct and proximate the cold air outlet, is arranged to channel hot air to a mixing region within the cold region adjacent the cold air outlet, is fluidly connecting the cold region with the hot environment, has an outlet positioned in the cold region, is configured to allow hot air to flow from the hot environment when a pressure in the hot environment exceeds a pressure in the cold region, and is configured to prevent cold air from flowing from the cold region to the hot environment;
receiving, by a temperature sensor positioned in the cold region, temperature data indicative of a temperature of a mixed flow of air between an inner mixing boundary and an outer mixing boundary proximate to the cold air outlet and to a hot air outlet of the hot air bypass duct;
determining, by comparing the temperature data to reference temperature data, that the temperature of the mixed flow of air exceeds a reference temperature indicative of recirculation of hot air from the hot environment into the cold region; and
instructing an air handler to increase a rate of the flow of cold air to the cold region by the cold air outlet in response to the determining.

17. The method of claim 16, further comprising:
determining that another measured temperature associated with the mixed flow of air does not exceed the reference temperature associated with the reference temperature data; and
in response to determining that the other measured temperature does not exceed the reference temperature, instructing the air handler to decrease the flow rate of cold air to the cold region by the cold air outlet.

18. The method of claim 16, further comprising:
determining that another measured temperature of the mixed flow of air falls within a reference temperature range; and
in response to determining that the other measured temperature falls within the reference temperature range, instructing the air handler to maintain the flow rate of cold air to the cold region.

19. The method of claim 16, further comprising:
receiving bypass temperature data associated with a bypass flow of air passing through the hot air bypass duct by a bypass temperature sensor positioned within the hot air bypass duct;
comparing the bypass temperature data with bypass reference temperature data;
determining whether a bypass temperature associated with the bypass duct falls below a bypass temperature threshold; and
in response to determining that the bypass temperature falls below the bypass temperature threshold, instructing an air handler to decrease the flow rate of cold air to the cold region.

* * * * *